(12) United States Patent
Keyser

(10) Patent No.: US 6,888,219 B2
(45) Date of Patent: May 3, 2005

(54) INTEGRATED STRUCTURE WITH MICROWAVE COMPONENTS

(75) Inventor: Thomas R. Keyser, Plymouth, MN (US)

(73) Assignee: Honeywell International, Inc., Morristown, NJ (US)

(*) Notice: Subject to any disclaimer, the term of this patent is extended or adjusted under 35 U.S.C. 154(b) by 195 days.

(21) Appl. No.: 10/230,680

(22) Filed: Aug. 29, 2002

(65) Prior Publication Data

US 2004/0041232 A1 Mar. 4, 2004

(51) Int. Cl.⁷ .................. H01L 27/108; H01L 29/04; H01L 29/76; H01L 31/36; H01L 31/112; H01L 29/94; H01L 31/119
(52) U.S. Cl. .................. 257/532; 257/296; 257/533; 257/536; 257/68
(58) Field of Search .............. 257/68–75, 295–310, 257/530–535

(56) References Cited

U.S. PATENT DOCUMENTS

| | | | |
|---|---|---|---|
| 4,571,816 A | 2/1986 | Dingwall | |
| 5,563,426 A | * 10/1996 | Zhang et al. | 257/66 |
| 5,952,695 A | 9/1999 | Ellis-Monaghan et al. | |
| 6,025,219 A | 2/2000 | Kinoshita | |
| 6,110,772 A | 8/2000 | Takada et al. | |
| 6,246,084 B1 | 6/2001 | Kim | |
| 6,294,834 B1 | 9/2001 | Yeh et al. | |
| 6,455,362 B1 | * 9/2002 | Tran et al. | 438/194 |
| 6,689,650 B2 | * 2/2004 | Gambino et al. | 257/302 |
| 2002/0139933 A1 | * 10/2002 | Iida et al. | 438/74 |

* cited by examiner

*Primary Examiner*—Cuong Nguyen
(74) *Attorney, Agent, or Firm*—Schiff Hardin LLP

(57) ABSTRACT

A semiconductor device has a silicon layer and a first dielectric layer. A transistor has a drain and a source that are at least partially in the silicon layer. The transistor further has a gate and a spacer defining the gate. The first dielectric layer forms the spacer. A capacitor has first and second electrodes, the first electrode is formed at least partially in the silicon layer, and the first dielectric layer provides a dielectric for the capacitor between the first and second electrodes. A resistor has a resistive region formed at least partially in the silicon layer and has first and second resistor contact areas defined by the first dielectric layer. A second dielectric layer electrically isolates the transistor, the capacitor, and the resistor from conductive lines.

35 Claims, 2 Drawing Sheets

INTEGRATED STRUCTURE WITH MICROWAVE COMPONENTS

TECHNICAL FIELD OF THE INVENTION

The present invention relates to integrated structures incorporating components such as microwave components.

BACKGROUND OF THE INVENTION

Integrated structures are used for a variety of DC and AC applications. For example, it is known to use integrated structures in radio and microwave frequency systems that receive radio and microwave frequency signals and that process those signals to provide useful outputs. Such systems can include receivers such as radio and television receivers, set top boxes for cable television, receivers in local area networks, test and measurement equipment, radar receivers, air traffic control receivers, and microwave communication links, among others.

Because of the application, integrated structures are often required to incorporate various tuning elements such as resistors, inductors, and/or capacitors in addition to the usual transistors and diodes normal to integrated circuit processing. The processing required to fabricate such elements in an integrated structure has been in the past complicated by the need for separate spacer, block, and/or capacitor dielectric deposition steps.

The present invention is directed to an integrated structure that simplifies past processing, and may be used not only for microwave CMOS devices but also for other digital and analog integrated circuit products that contain similar passive elements.

SUMMARY OF THE INVENTION

In accordance with one aspect of the present invention, a semiconductor device comprises a silicon layer, a dielectric layer, a transistor, and a capacitor. The transistor has a drain and a source formed at least partially in the silicon layer. The transistor further has a gate, and a spacer defining distances between the source and the gate and between the drain and the gate. The spacer is provided by the dielectric layer. The capacitor has first and second electrodes, and the first electrode is formed at least partially in the silicon layer. The dielectric layer provides a dielectric for the capacitor between the first and second electrodes.

In accordance with another aspect of the present invention, a semiconductor device comprises a silicon layer, a dielectric layer, a transistor, and a resistor. The transistor has a drain and a source formed at least partially in the silicon layer. The transistor further has a gate, and a spacer defining distances between the source and the gate and between the drain and the gate. The spacer is provided by the dielectric layer. The resistor has a resistive region formed at least partially in the silicon layer, and first and second resistor contact areas defined by the dielectric layer.

In accordance with still another aspect of the present invention, a semiconductor device comprises a silicon layer, a dielectric layer, a transistor, a capacitor, and a resistor. The transistor has a drain and a source formed at least partially in the silicon layer. The transistor further has a gate, and a spacer defining the gate. The spacer is provided by the dielectric layer. The capacitor has first and second electrodes, the first electrode is formed at least partially in the silicon layer, and the dielectric layer provides a dielectric for the capacitor between the first and second electrodes. The resistor has a resistive region formed at least partially in the silicon layer, and first and second resistor contact areas defined by the dielectric layer.

In accordance with yet another aspect of the present invention, a semiconductor device comprises a handle wafer, an SOI wafer including a silicon layer and an insulation layer over the handle wafer, and a capacitor having first and second electrodes and a dielectric between the first and second electrodes. The first electrode is formed in the silicon layer of the SOI wafer.

In accordance with a further aspect of the present invention, a microwave circuit comprises an SOI wafer, a transistor, and a passive circuit element. The SOI wafer includes a single crystal silicon layer and an insulating layer. The transistor has a gate, a source, and a drain. The source and drain are formed in the single crystal silicon layer. The passive circuit element is formed in the single crystal silicon layer.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 1:
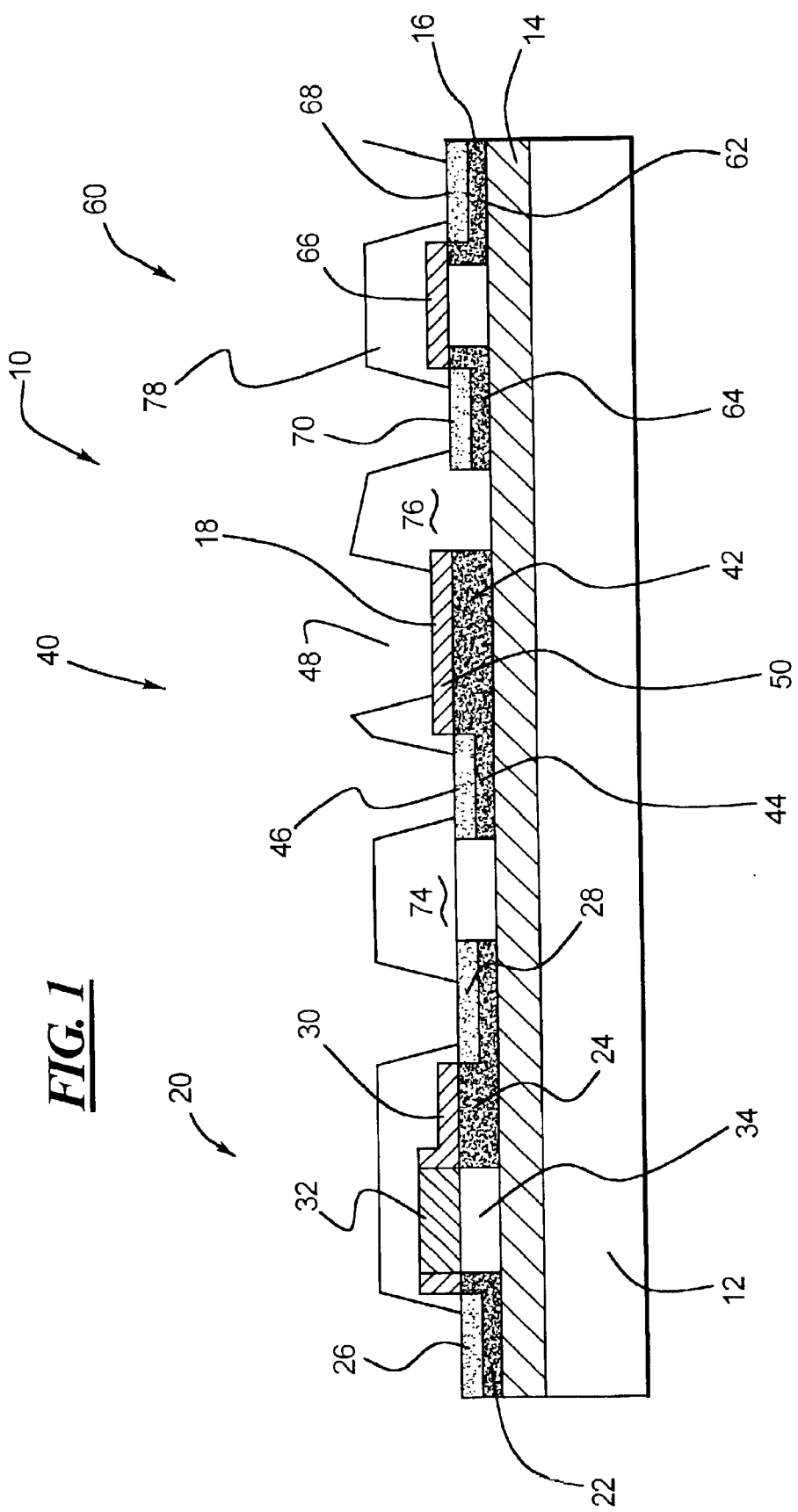
FIG. 1 is a cross-sectional view of an integrated structure incorporating various aspects of the present invention; and, FIGS. 2a, 2b, and 2c illustrate other aspects of the present invention.

As shown in FIG. 1, an integrated structure 10 has a handle wafer 12 formed of a material such as polysilicon, single crystalline silicon, or sapphire. An insulation layer 14 is provided over the handle wafer 21. The insulation layer 14, for example, may be an oxide layer such as a silicon dioxide layer. A silicon layer 16, which may be comprised of single crystalline silicon, for example, is provided over the insulation layer 14. The handle wafer 12, the insulation layer 14, and the silicon layer 16 comprise an SOI wafer with the insulation layer 14 of the SOI wafer abutting the handle wafer 12.

A dielectric layer 18 is formed over the silicon layer 16 and a gate layer 32. The dielectric layer 18 may be formed of a suitable material such as an oxide, a nitride, tantalum pentoxide ($Ta_2O_5$), etc.

A transistor 20 may be fabricated at least partially in the silicon layer 16. In forming the transistor 20, a first region 22 of the silicon layer 16 is appropriately doped to form a source of the transistor 20, and a second region 24 of the silicon layer 16 is appropriately doped to form a drain of the transistor 20. Suitable regions of the dielectric layer 18 are etched away, and the silicon in the first and second regions 22 and 24 is exposed so that silicide regions 26 and 28 can be prepared in order to form respective metal contacts for the source and drain of the transistor 20.

During etching of the dielectric layer 18, sufficient dielectric is allowed to remain in the area of the transistor 20 to form a spacer region 30. The spacer region 30 defines the distance between the heavily doped source and drain regions and the gate electrode 32, and can be used to extend the drain of the transistor 20, formed by the second region 24 of the silicon layer 16, to form a higher voltage device. Accordingly, the transistor 20 is illustrated with an extended drain electrode. Conventional transistors with symmetrical source and drain regions can also be fabricated.

The dielectric layer 18 is also used to form a capacitor 40 as part of the integrated structure 10. A region 42 of the silicon layer 16 is suitably doped to thereby form a first electrode of the capacitor 40. During etching of the dielectric layer 18, the dielectric in the dielectric layer 18 above a portion 44 of the region 42 is completely etched away. During silicidation of the integrated structure 10, a silicide region 46 is formed to provide a contact to the first electrode of the capacitor 40 provided by the region 42 of the silicon layer 16. A second electrode of the capacitor 40 is provided by applying metal to an opening 48 in a dielectric layer 78 above a portion 50 of the dielectric layer 18 that remains after the dielectric layer 18 is etched. The portion 50 of the dielectric layer 18 provides the dielectric between the first and second electrodes of the capacitor 40.

The dielectric layer 18 is further used to define a resistor 60 as part of the integrated structure 10. Regions 62 and 64 of the silicon layer 16 are suitably doped. During etching of the dielectric layer 18, the dielectric in the dielectric layer 18 above portions of the regions 62 and 64 is masked and etched to leave a portion 66 of the dielectric layer 18 remaining after the dielectric layer 18 is etched. The portion 66 of the dielectric layer 18 is used to define the contact regions that are provided for the resistor 60. During silicidation of the integrated structure 10, a silicide region 68 is formed to provide, along with the region 62, a first contact for the resistor 60, and a silicide region 70 is formed to provide, along with the region 64, a second contact for the resistor 60.

The dielectric layer 78 is added in order to electrically isolate the transistor 20, the capacitor 40, and the resistor 60 from the conductive lines that connect the devices. Vias are formed through the dielectric layer 78 in order to permit access to the contacts provided by the silicide regions 26, 28, 46, 68, and 70. Also, the opening 48 is formed in the dielectric layer 78 and receives a metal in order to form the second electrode of the capacitor 40.

Figure 2A:
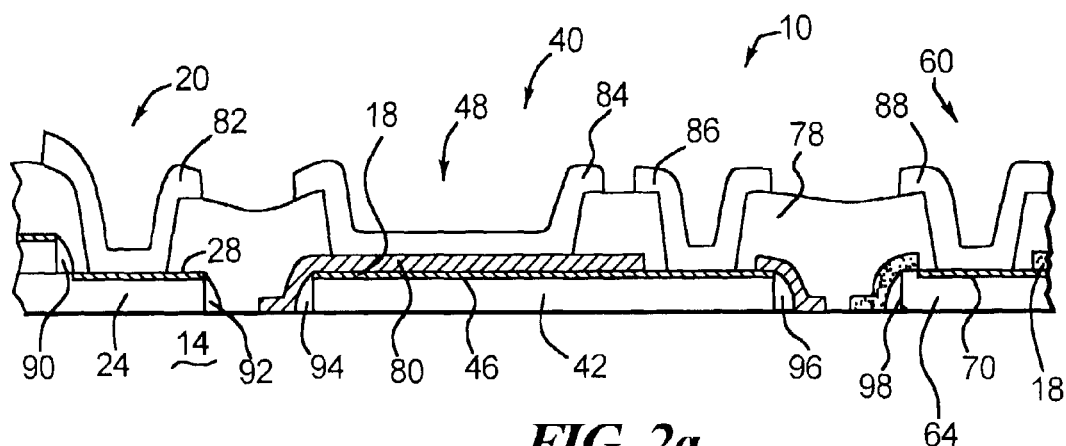

FIG. 2a illustrates an embodiment of the integrated structure 10 in which a nitride 80 or other suitable dielectric is used only for the dielectric of the capacitor 40. Accordingly, the dielectric layer 18 performs the spacing and defining functions discussed above with respect to the transistor 20 and the resistor 60. Also, as can be seen from FIG. 2a, a metal 82 is provided to electrically contact the silicide region 28, a metal 84 is provided in the opening 48 to form the second electrode of the capacitor 40, a metal 86 is provided to electrically contact the silicide region 46, and a metal 88 is provided to electrically contact the silicide region 70. Further, an oxide can be deposited to form a plurality of spacers 90, 92, 94, 96, 98, etc. Although not shown in FIG. 2a, additional metal is provided to electrically contact the silicide regions 26 and 68.

Figure 2B:
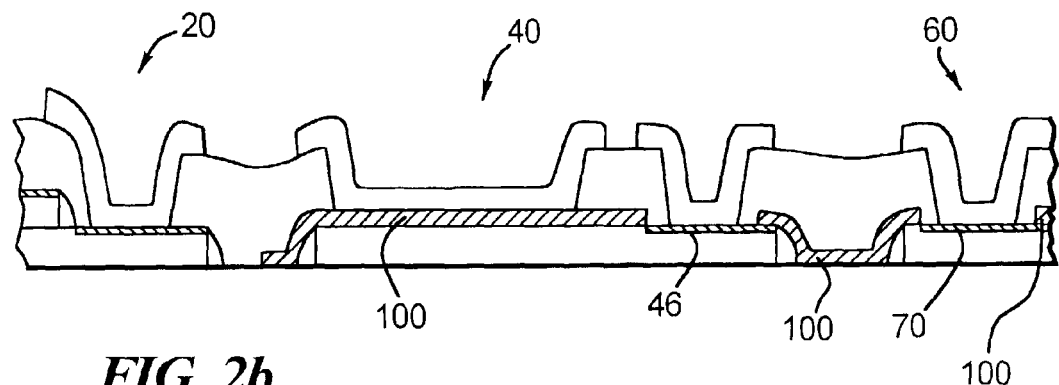

FIG. 2b illustrates an embodiment of the integrated structure 10 in which a nitride or other layer 100 is used for the dielectric of the capacitor 40. Additionally, or alternatively, the nitride or other layer 100, during silicidation, may be used to confine the silicide regions 46 and 70 to their respective contact regions.

Figure 2C:
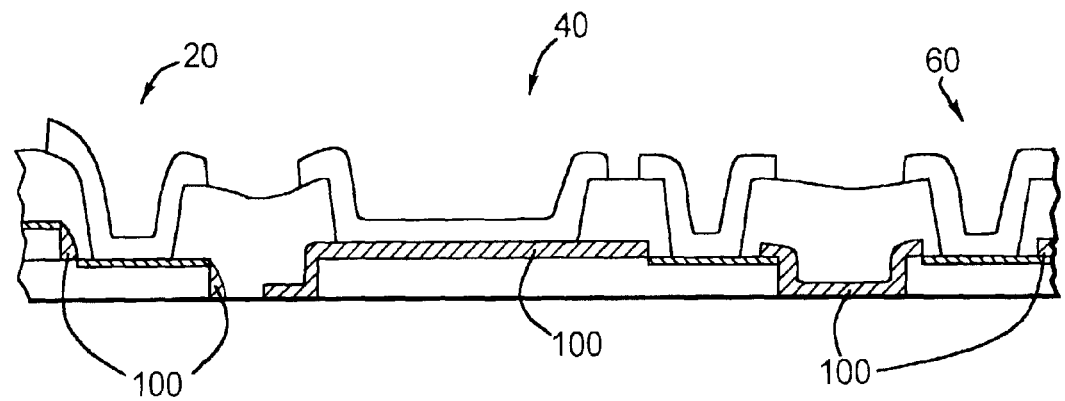

FIG. 2c illustrates an embodiment of the integrated structure 10 in which the nitride or other layer 100 can be used for the spacer region 30 of the transistor 20. Additionally, or alternatively, the nitride or other layer 100 may be used for the dielectric of the capacitor 40, and/or the nitride or other layer 100, during silicidation, may be used to confine the suicide regions 46 and 70 to their respective contact regions.

Certain modifications of the present invention have been discussed above. Other modifications will occur to those practicing in the art of the present invention. Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A semiconductor device comprising:

a silicon layer;

a dielectric layer;

a transistor having a heavily doped drain and a heavily doped source formed at least partially in the silicon layer, the transistor further having a gate and a spacer defining distances between the heavily doped source and the gate and between the heavily doped drain and the gate, wherein the spacer is provided by the dielectric layer; and, a capacitor having first and second electrodes, wherein the first electrode is formed at least partially in the silicon layer, and wherein the dielectric layer provides a dielectric for the capacitor between the first and second electrodes.

2. The semiconductor device of claim 1 further comprising an insulation layer below the silicon layer and a handle wafer below the insulation layer.

3. The semiconductor device of claim 1 further comprising a resistor, wherein the resistor comprises:

a resistive region formed at least partially in the silicon layer; and, first and second resistor contact areas defined by the dielectric layer.

4. The semiconductor device of claim 1 wherein the spacer defines an extension of the drain of the transistor.

5. The semiconductor device of claim 1 wherein the dielectric layer comprises a nitride only for the capacitor.

6. The semiconductor device of claim 1 wherein the dielectric layer comprises a nitride for the transistor and for the capacitor.

7. The semiconductor device of claim 1 wherein the dielectric layer comprises a first dielectric layer, wherein the semiconductor device comprises a second dielectric layer, and wherein the second dielectric layer electrically isolates at least portions of the transistor and the capacitor from conductive lines.

8. The semiconductor device of claim 7 further comprising a resistor, wherein the resistor comprises:

a resistive region formed at least partially in the silicon layer; and, first and second resistor contact areas defined by the first dielectric layer, wherein the second dielectric layer electrically isolates at least portions of the transistor, the capacitor, and the resistor from conductive lines.

9. The semiconductor device of claim 8 wherein the first dielectric layer comprises a nitride for the transistor, for the capacitor, and for the resistor.

10. The semiconductor device of claim 8 wherein the spacer defines an extension of the drain of the transistor.

11. A semiconductor device comprising:

a silicon layer;

a dielectric layer;

a transistor having a heavily doped drain and a heavily doped source formed at least partially in the silicon layer, the transistor further having a gate and a spacer defining distances between the heavily doped source and the gate and between the heavily doped drain and the gate, wherein the spacer is provided by the dielectric layer; and, a resistor having a resistive region formed at least partially in the silicon layer, and first and second resistor contact areas defined by the dielectric layer.

12. The semiconductor device of claim 11 further comprising an insulation layer below the silicon layer and a handle wafer below the insulation layer.

13. The semiconductor device of claim 11 wherein the spacer defines an extension of the drain of the transistor.

14. The semiconductor device of claim 11 wherein the dielectric layer comprises a first dielectric layer, wherein the semiconductor device comprises a second dielectric layer, and wherein the second dielectric layer electrically isolates at least portions of the transistor and the resistor from conductive lines.

15. The semiconductor device of claim 14 wherein the spacer defines an extension of the drain of the transistor.

16. The semiconductor device of claim 11 wherein the dielectric layer comprises a nitride for the transistor and for the resistor.

17. The semiconductor device of claim 11 wherein the dielectric layer comprises a nitride for the resistor.

18. The semiconductor device of claim 11 wherein a portion of the dielectric layer defines the first and second resistor contact areas, and wherein the portion is between the first and second resistor contact areas.

19. A semiconductor device comprising:
   a silicon layer;
   a dielectric layer;
   a transistor having a heavily doped drain and a heavily doped source formed at least partially in the silicon layer, the transistor further having a gate and a spacer defining distances between the heavily doped source and the gate and between the heavily doped drain and the gate, wherein the spacer is provided by the dielectric layer;
   a capacitor having first and second electrodes, wherein the first electrode is formed at least partially in the silicon layer, and wherein the dielectric layer provides a dielectric for the capacitor between the first and second electrodes; and,
   a resistor having a resistive region formed at least partially in the silicon layer, and first and second resistor contact areas defined by the dielectric layer.

20. The semiconductor device of claim 19 further comprising an insulation layer below the silicon layer and a handle wafer below the insulation layer.

21. The semiconductor device of claim 19 wherein the spacer defines an extension of the drain of the transistor.

22. The semiconductor device of claim 21 further comprising an insulation layer below the silicon layer and a handle wafer below the insulation layer.

23. The semiconductor device of claim 19 wherein the dielectric layer comprises a nitride only for the capacitor.

24. The semiconductor device of claim 19 wherein the dielectric layer comprises a nitride only for the capacitor and the resistor.

25. The semiconductor device of claim 19 wherein the dielectric layer comprises a nitride for the transistor, for the capacitor, and for the resistor.

26. The semiconductor device of claim 19 wherein the dielectric layer comprises a first dielectric layer, wherein the semiconductor device comprises a second dielectric layer, and wherein the second dielectric layer electrically isolates at least portions of the transistor, the capacitor, and the resistor from conductive lines.

27. A microwave circuit comprising:
   an SOI wafer including a single crystal silicon layer and an insulating layer;
   a transistor having a gate, a source, and a drain, wherein the source and drain are formed in the single crystal silicon layer; and,
   first and second passive circuit elements formed in the single crystal silicon layer.

28. The microwave circuit of claim 27 further comprising a handle wafer against the insulation layer of the SOI wafer.

29. The microwave circuit of claim 28 wherein handle wafer comprises polysilicon.

30. The microwave circuit of claim 28 wherein handle wafer comprises sapphire.

31. The microwave circuit of claim 27 wherein the first passive circuit element comprises a capacitor.

32. The microwave circuit of claim 27 wherein the first passive circuit element comprises a resistor.

33. The microwave circuit of claim 27 wherein the first passive circuit element comprises a capacitor, and wherein the second passive circuit element comprises a resistor.

34. A semiconductor device comprising:
   a silicon layer;
   a dielectric layer;
   a transistor having a drain and a source formed at least partially in the silicon layer, the transistor further having a gate and a spacer, wherein the spacer abuts a side of the gate, and wherein the spacer is provided by the dielectric layer; and,
   a capacitor having first and second electrodes, wherein the first electrode is formed at least partially in the silicon layer, and wherein the dielectric layer provides a dielectric for the capacitor between the first and second electrodes.

35. A semiconductor device comprising:
   a silicon layer;
   a dielectric layer;
   a resistor having a resistive region formed at least partially in the silicon layer, and first and second resistor contact areas defined by the dielectric layer; and,
   a capacitor having first and second electrodes, wherein the first electrode is formed at least partially in the silicon layer, and wherein the dielectric layer provides a dielectric for the capacitor between the first and second electrodes.

* * * * *